(12) United States Patent
Ryu et al.

(10) Patent No.: US 9,704,975 B2
(45) Date of Patent: Jul. 11, 2017

(54) METHOD OF MANUFACTURING NON VOLATILE MEMORY DEVICE

(71) Applicant: Magnachip Semiconductor, Ltd., Cheongju-si (KR)

(72) Inventors: Doo Yeol Ryu, Cheongju-si (KR); Jeong Ho Cho, Hwaseong-si (KR); Kyung Ho Lee, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/851,509

(22) Filed: Sep. 11, 2015

(65) Prior Publication Data

US 2016/0093707 A1 Mar. 31, 2016

(30) Foreign Application Priority Data

Sep. 29, 2014 (KR) ........................ 10-2014-0129946

(51) Int. Cl.
*H01L 29/66* (2006.01)
*H01L 21/28* (2006.01)
(Continued)

(52) U.S. Cl.
CPC .. *H01L 29/66825* (2013.01); *H01L 21/28273* (2013.01); *H01L 29/42324* (2013.01); *H01L 29/7883* (2013.01)

(58) Field of Classification Search
CPC ........... H01L 29/66825; H01L 29/4234; H01L 29/7883; H01L 29/42328; H01L 29/42324; H01L 29/42344
See application file for complete search history.

(56) References Cited

U.S. PATENT DOCUMENTS 6,248,633 B1 * 6/2001 Ogura ................. G11C 11/5671
257/E21.679
7,087,955 B2 * 8/2006 Kawashima ...... H01L 21/28273
257/257

(Continued)

FOREIGN PATENT DOCUMENTS

KR   10-2005-0031754 B1   9/2003
KR      10-1026288 B1     3/2011

OTHER PUBLICATIONS

English machine translation of KR-10-2005-0031754 including full drawings, KIPO machine translation on Jul. 23, 2016, pp. 1-26.*

*Primary Examiner* — Earl Taylor
(74) *Attorney, Agent, or Firm* — NSIP Law

(57) ABSTRACT

A non-volatile memory device includes a semiconductor substrate, a well region situated on the semiconductor substrate, a floating gate situated on the well region, a floating gate channel region, a control gate situated on both sides of the floating gate, a control gate channel region, and an ion implantation area for regulating a program threshold voltage integrally formed between an area underneath of the floating gate and the control gate and a foreside of the well region, wherein a doping concentration of the ion implantation area for regulating a program threshold voltage is greater than a doping concentration of the well region. Therefore, the non-volatile memory device of examples integrally forms an ion implantation area for regulating a program threshold voltage irrespective of a channel region of a floating gate and a control gate so as to guarantee durability of a non-volatile memory device.

22 Claims, 9 Drawing Sheets

(51) Int. Cl.
*H01L 29/423* (2006.01)
*H01L 29/788* (2006.01)

(56) References Cited

U.S. PATENT DOCUMENTS

| | | | |
|---|---|---|---|
| 7,196,372 B1* | 3/2007 | Yu | H01L 21/28273 257/315 |
| 7,678,640 B1* | 3/2010 | Polishchuk | H01L 21/26586 438/217 |
| 2002/0005545 A1* | 1/2002 | Widdershoven | H01L 27/11568 257/314 |
| 2005/0035393 A1* | 2/2005 | Lung | H01L 21/28282 257/314 |
| 2006/0071264 A1* | 4/2006 | Hemink | H01L 27/115 257/315 |
| 2006/0081910 A1* | 4/2006 | Yu | H01L 21/28273 257/315 |
| 2006/0223292 A1* | 10/2006 | Okonogi | H01L 21/823425 438/530 |
| 2006/0281254 A1* | 12/2006 | Lee | H01L 29/7881 438/257 |
| 2009/0004837 A1* | 1/2009 | Rouh | H01L 21/26513 438/525 |
| 2009/0065846 A1* | 3/2009 | Tsai | H01L 27/115 257/321 |
| 2009/0152608 A1* | 6/2009 | Choi | H01L 27/10855 257/296 |
| 2009/0189211 A1* | 7/2009 | Orimoto | H01L 27/11519 257/319 |
| 2009/0200603 A1* | 8/2009 | Ogura | H01L 21/28282 257/326 |
| 2009/0261446 A1* | 10/2009 | Gogoi | H01L 29/7816 257/500 |
| 2010/0081267 A1* | 4/2010 | Purayath | H01L 21/28273 438/594 |
| 2011/0249500 A1* | 10/2011 | Cha | H01L 21/28273 365/185.08 |
| 2012/0261736 A1* | 10/2012 | Hsu | H01L 21/28273 257/315 |
| 2013/0240977 A1* | 9/2013 | Kaneoka | H01L 29/66833 257/325 |
| 2014/0015014 A1* | 1/2014 | Cheng | H01L 29/167 257/288 |
| 2014/0183649 A1* | 7/2014 | Lee | H01L 21/823842 257/369 |
| 2014/0183651 A1* | 7/2014 | Lee | H01L 21/823857 257/369 |
| 2015/0091072 A1* | 4/2015 | Wu | H01L 27/11517 257/316 |
| 2015/0129953 A1* | 5/2015 | Owada | H01L 27/11568 257/326 |
| 2015/0206805 A1* | 7/2015 | Lee | H01L 21/823857 438/217 |
| 2016/0093707 A1* | 3/2016 | Ryu | H01L 21/28273 257/316 |

* cited by examiner

METHOD OF MANUFACTURING NON VOLATILE MEMORY DEVICE

CROSS-REFERENCE TO RELATED APPLICATION(S)

This application claims the benefit under 35 USC 119(a) of Korean Patent Application No. 10-2014-0129946, filed on Sep. 29, 2014 in the Korean Intellectual Property Office, the entire disclosure of which is incorporated herein by reference for all purposes.

BACKGROUND

1. Field

The following description relates to a method of manufacturing a non-volatile memory device. The following description further relates to a method of manufacturing a non-volatile memory device to form an ion implantation area, irrespective of a channel region of a floating gate and a control gate, for regulating a program threshold voltage to increase a doping level.

2. Description of Related Art

Generally, a non-volatile memory device is called an Electrically Erasable and Programmable Read Only Memory (EEPROM) and corresponds to a long-term persistent storage device that is able to persistently store data even without a power supply. The EEPROM electrically erases data recorded to the inside of the memory device to rewrite data through transforming an Erasable Programmable Read Only Memory (EPROM). Therefore, a non-volatile memory device that is to be conveniently used in an application field requires the ability to rewrite a program stored on the memory device. As a non-volatile memory device is able to electrically read and write data, it is able to be reprogrammed to maintain a built-in state in a system. However, such a non-volatile memory device at present has several issues. For instance, a non-volatile memory device takes more time to rewrite data than an ordinary random-access memory (RAM) and has a small storage capacity. Also, the number of times of reliably rewriting data in the memory is limited in a non-volatile memory device. However, an EEPROM has an advantage over ordinary RAM in that it is able to preserve data recorded to an EEPROM for a long time without a continuous power supply. Thus, an EEPROM is used in various fields.

One approach uses a semiconductor device technology, and more specifically, provides a semiconductor device and manufacture method thereof to improve an electric characteristic of a non-volatile memory through using a split gate memory cell structure and a nitride film as a charge capacitance layer.

Such an approach discloses a semiconductor IC (Integrated Circuit) apparatus, and more specifically, provides an apparatus to read memory information from a non-volatile memory cell transistor at high speed.

However, it may cause a tunnel oxide film to be damaged that electrons of a non-volatile memory are repeatedly carried by repeated program and erase operations that recur hundreds of thousands of times. Therefore, when electrons are carried in this manner, more electrons than predetermined relevant electrons may be carried along a tunnel oxide film or a portion of electrons may disappear. Accordingly, a voltage level of a program voltage Vp and an erase voltage Ve used to determine a program and to perform an erase operation comes close to a read voltage Vr. Because the voltages become close to one another, the memory may not be able to reliably guarantee the success of a read operation, a write operation, an erase operation, or a program operation of a non-volatile memory.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

One example proposes a method of manufacturing a non-volatile memory device to raise a program threshold voltage by increasing the quantity of ion implanted into an ion implantation area for regulating a program threshold voltage.

One example proposes a method of manufacturing a non-volatile memory device to maintain a constant voltage level difference between a program voltage Vp and a erase voltage Ve by integrally forming an ion implantation area for regulating a program threshold voltage in a floating gate and a control gate.

One example proposes a method of manufacturing a non-volatile memory device to guarantee a durability of a non-volatile memory device by increasing a voltage level difference between a program voltage Vp and an erase voltage Ve.

In one general aspect, a non-volatile memory device includes a semiconductor substrate, a well region of a first conductivity type situated on the semiconductor substrate, a floating gate situated on the well region, a floating gate channel region situated between an area underneath of the floating gate and a foreside of the well region, a control gate situated on both sides of the floating gate, a control gate channel region formed between an area underneath of the control gate and a foreside of the well region, and an ion implantation area for regulating a program threshold voltage of the first conductivity type integrally formed between an area underneath of the floating gate and the control gate and a foreside of the well region, wherein a doping concentration of the ion implantation area for regulating a program threshold voltage is greater than a doping concentration of the well region.

The non-volatile memory device may further include a shallow trench isolation (STI) region situated on a side of the semiconductor substrate, a tunnel oxide film situated between the floating gate and the ion implantation area for regulating a program threshold voltage, a dielectric film situated between the floating gate and the control gate to insulate the area between the floating gate and the control gate, an insulator film of the control gate situated between the control gate and the ion implantation area for regulating a program threshold voltage, and a source-drain region exposed at a side of the control gate and situated in the well region.

A depth of the ion implantation area for regulating a program threshold voltage may be shallower than a depth of the source-drain region.

The ion implantation area for regulating a program threshold voltage may be simultaneously formed in the floating gate channel region and the control gate channel region and may simultaneously regulate a program voltage Vp and an erase voltage Ve.

A voltage level difference between the program voltage Vp and the erase voltage Ve may increase according to the increase of a dose of dopant implanted into the ion implantation area for regulating a program threshold voltage.

A voltage level of the program voltage Vp may be associated with a range of 3.5V and 6V and a voltage level of the erase voltage Ve may be associated with a range of 1V and 2.5V.

A dopant implanted into the ion implantation area for regulating a program threshold voltage may be formed using a dose in a range of $1E11/cm^2$ and $1E14/cm^2$.

A method of manufacturing a non-volatile memory device may include forming a shallow trench isolation (STI) region and an active region on a semiconductor substrate, forming a well region in the active region of a first conductivity type, implanting a dopant into the active region to form a ion implantation area for regulating a program threshold voltage, forming a floating gate and a control gate on the ion implantation area for regulating a program threshold voltage, and forming a source-drain region, exposed at a side of the control gate, on the well region.

A doping concentration of the ion implantation area for regulating a program threshold voltage may be greater than a doping concentration of the well region.

The ion implantation area for regulating a program threshold voltage may be integrally formed in an area underneath of the floating gate and the control gate.

The ion implantation area for regulating a program threshold voltage may be simultaneously formed in a floating gate channel region and a control gate channel region and may simultaneously regulates a program voltage Vp and an erase voltage Ve.

A voltage level difference between the program voltage Vp and the erase voltage Ve may increase according to increasing of a dose of dopant implanted to the ion implantation area for regulating a program threshold voltage.

A voltage level of the program voltage Vp may be associated with a range of 3.5V and 6V and a voltage level of the erase voltage Ve may be associated with a range of 1V and 2.5V.

A dopant implanted into the ion implantation area for regulating a program threshold voltage may be formed with a dose in a range of $1E11/cm^2$ and $1E14/cm^2$.

A depth of the ion implantation area for regulating a program threshold voltage may be shallower than a depth of the source-drain region.

In another general aspect, a non-volatile memory device includes a floating gate situated on a well region situated on a semiconductor substrate, a floating gate channel region situated between an area underneath of the floating gate and a foreside of the well region, a control gate situated on both sides of the floating gate, a control gate channel region formed between an area underneath of the control gate and a foreside of the well region, and an ion implantation area for regulating a program threshold voltage integrally formed between an area underneath of the floating gate and the control gate and a foreside of the well region, wherein a doping concentration of the ion implantation area for regulating a program threshold voltage is greater than a doping concentration of the well region.

The non-volatile memory device may further include a shallow trench isolation (STI) region situated on a side of the semiconductor substrate, a tunnel oxide film situated between the floating gate and the ion implantation area for regulating a program threshold voltage, a dielectric film situated between the floating gate and the control gate to insulate the area between the floating gate and the control gate, an insulator film of the control gate situated between the control gate and the ion implantation area for regulating a program threshold voltage, and a source-drain region exposed at a side of the control gate and situated in the well region.

A depth of the ion implantation area for regulating a program threshold voltage may be shallower than a depth of the source-drain region.

The ion implantation area for regulating a program threshold voltage may be simultaneously formed in the floating gate channel region and the control gate channel region and may simultaneously regulate a program voltage Vp and an erase voltage Ve.

A voltage level difference between the program voltage Vp and the erase voltage Ve may increase according to the increase of a dose of dopant implanted into the ion implantation area for regulating a program threshold voltage.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
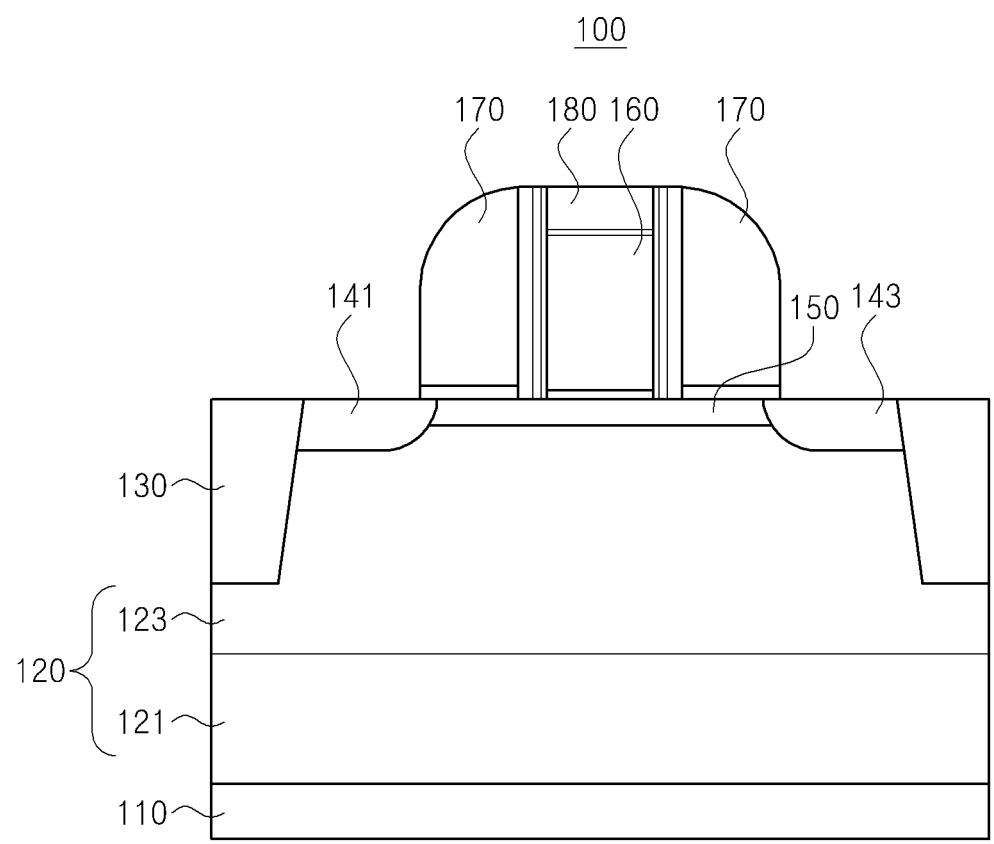
FIG. 1 is a cross-sectional diagram illustrating a non-volatile memory device according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

While terms such as "first," "second," and the like, are used to describe various components, such components are not to be understood as being limited to the terms. The terms are merely used to help the reader to distinguish one component from another.

It is to be understood that when an element is referred to as being "connected to" or "connected with" another element, the element is potentially directly connected to the other element or intervening elements are also potentially present. In contrast, when an element is referred to as being "directly connected to" another element, no intervening elements are understood to be present, except where the context makes it clear that other intervening elements are understood to be present. In addition, unless explicitly described to the contrary, the word "comprise" and variations such as "comprises" or "comprising," or synonyms such as "including" or "having," are intended to be understood to imply the inclusion of stated elements but not the exclusion of any other elements. Meanwhile, other expressions describing relationships between components such as "between", "immediately between" or "adjacent to" and "directly adjacent to" are to be construed similarly.

Singular forms, such as "a", "an" and "the", in the present disclosure are intended to include the plural forms as well, unless the context clearly indicates otherwise.

Devices that are in communication with each other are not required to be in continuous communication with each other, unless expressly specified otherwise. In addition, devices that are in communication with each other potentially communicate directly or indirectly through one or more intermediaries, as appropriate for a given example.

Although process steps, method steps, algorithms, or the like, are described in a sequential order in an example, such processes, methods and algorithms are potentially configured to work in alternate orders in other examples. In other words, any sequence or order of steps that is described does not necessarily indicate a requirement that the steps be performed in that order, unless expressly described otherwise. For example, the steps of the processes, methods or algorithms described herein may be performed in any order practical. Further, some steps are performed simultaneously, where appropriate or relevant.

When a single device or article is described herein, it is intended to be readily apparent that more than one device or article is to be used in place of a single device or article. Similarly, where more than one device or article is described herein, it is intended to be readily apparent that a single device or article is potentially used in place of the more than one device or article. The functionality or the features of a device is alternatively embodied by one or more other devices that are not explicitly described as having such functionality or features.

FIG. 1 is a cross-sectional diagram illustrating a non-volatile memory device according to an example.

Figure 2:
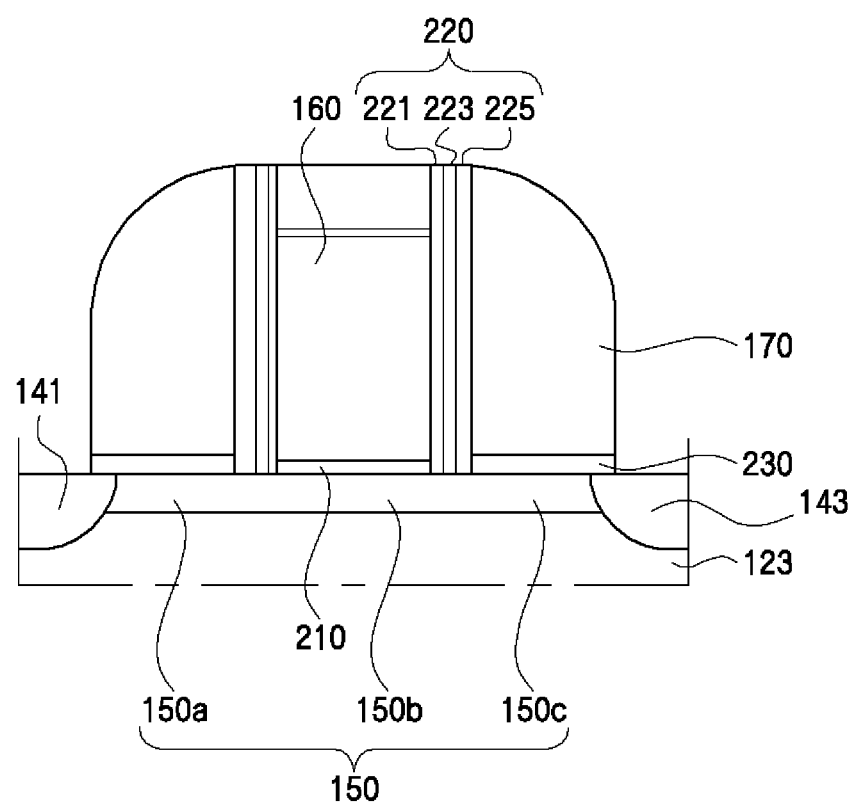
FIG. 2 is a cross-sectional block diagram magnifying a floating gate and a control gate formed in a foreside of an ion implantation area for regulating a program threshold voltage.

Referring to FIG. 1 and FIG. 2, a non-volatile memory device 100 includes a semiconductor substrate 110, a well region 120, a shallow trench isolation region (STI) 130, source-drain regions 141, 143, an ion implantation area for regulating a program threshold voltage (Channel doping region) 150, a floating gate 160, a control gate 170, a tunnel oxide film 210, a dielectric film 220 and a gate insulator film 230 for the control gate.

In the present examples, a program operation refers to a state where a floating gate 160 is filled with electrons and an erase operation refers to a state of subtracting electrons from a floating gate 160. Also, a write operation includes both a program operation and an erase operation, as explained above. A read operation refers to determining the quantity of electrons filling a floating gate 160. Thus, in an example, a state in which a floating gate 160 fully filled with electrons corresponds to 1 and a state in which a floating gate 160 is fully empty without electrons corresponds to 0.

A program voltage Vp corresponds to a program threshold voltage Vt in which electrons in a floating gate channel region move to a floating gate 160. When a program voltage is high, a high voltage is supplied to a floating gate 160 and a control gate 170. Also, in an example, a voltage supplied to a floating gate 160 is determined by a coupling ratio of a control gate 170.

A semiconductor substrate 110 is formed from a substrate of p-type, for example, a silicon substrate, as a base for integrating a non-volatile memory device 100, discussed further, below.

In this example, a well region 120 is formed on a semiconductor substrate 110 and is divided into a deep N well 121 and P well 123. That is, a well region 120 alternatively forms a photo resist on a screen oxide film 322 (See FIGS. 3A-3E), not shown, on a semiconductor substrate 110 and implants a dopant to form a deep N well 121 and P well 123.

More specifically, a deep N well 121 is formed underneath a P well 123 to separate the P well 123 from a semiconductor substrate 110 and to block an inflow of a hot carrier that is generated by the semiconductor substrate 110 into the P well 123.

A shallow trench isolation region (STI) 130 physically and electrically decouples a plurality of non-volatile memory devices. For example, a shallow trench isolation (STI) 130 is formed by a Local Oxidation of Silicon (LOCOS) process or a Shallow Trench Isolation (STI) process. In this example, source-drain regions 141, 143 are exposed at a side of the control gate and formed in the well region. That is, source-drain regions 141, 143 are formed in a P well 123 and divided into a source region 141 and a drain region 143.

An ion implantation area for regulating a program threshold voltage 150 is located at a region underneath 150$b$ a floating gate 160 and at regions underneath 150$a$, 150$c$ a control gate 170. An ion implantation area for regulating a program threshold voltage 150 is a channel doping region including a floating gate channel region 150$b$ and a control gate channel regions 150$a$, 150$c$. That is, in the example of FIG. 2, the middle of an ion implantation area for regulating a program threshold voltage 150 corresponds to a floating gate channel region 150$b$ and the underneath of a control gate 170 corresponds to control gate channel regions 150$a$, 150$c$. Therefore the ion implantation area for regulating a program threshold voltage 150 is simply called as a channel doping region 150. Herein, the regulating a program threshold voltage means controlling the program threshold voltage level, Vp.

An ion implantation area for regulating a program threshold voltage, such as a doping region having a P-type conductivity 150, is integrally formed in a foreside of a P well 123. For example, a dopant of an ion implantation area for regulating a program threshold voltage 150 is a Boron or Boron Difluoride (BF2) dopant having a same conductive type with a P well 123. However, these are only example dopants, and other appropriate dopants are used in other examples. By using a dopant having a same conductive type with a P well, in such an example, a program voltage Vp is further increased. A dose implanted to an ion implantation area for regulating a program threshold voltage 150 is formed with a dose in a range of $1E11/cm^2$ and $1E14/cm^2$ so that by using these doses provides for an appropriate program voltage Vp and an appropriate erase voltage Ve for the present examples. Also, a depth of an ion implantation area for regulating a program threshold voltage 150 is formed to be shallower than a maximum depth of the source-drain regions 141, 143 so that the ion implantation does not go beyond the bottom of these regions. Otherwise, it is difficult to increase a program threshold voltage above a certain level.

In another example, after a floating gate 160 is formed, when ions for regulating a program threshold voltage are implanted into a floating gate 160, an ion implantation area for regulating a program threshold voltage 150 is formed in the outside of a floating gate 160. In this example, a program threshold voltage is not increased because a dose of p-type dopant implanted to a floating gate channel region 150*b* is small. In such an example, it is useful to implant p-type dopant into a floating gate channel region 150*b* to appropriately affect and control a program threshold voltage.

So, the present examples, before forming a floating gate 160 and a control gate 170, form an ion implantation area for regulating a program threshold voltage 150. By doing so, an ion implantation area 150 is formed in both a floating gate channel region 150*b* and in control gate channel regions 150*a*, 150*c* and this approach allows a program threshold voltage to be easily regulated.

A voltage level of a program voltage Vp is determined according to the quantity of dopant implanted to an ion implantation area for regulating a program threshold voltage 150. For example, in FIG. 4, a method of determining a voltage level of a program voltage Vp according to the quantity of dopant implanted to an ion implantation area for regulating a program threshold voltage 150 is illustrated in detail using a graph.

For example, a tunnel oxide film 210 is formed between a foreside of an ion implantation area for regulating a program threshold voltage 150 and an area underneath a floating gate 160. In FIG. 2, a tunnel oxide film 210 is illustrated further. A floating gate 160 is formed on a well region 120, more specifically, on a tunnel oxide film 210. In some examples, the floating gate 160 uses a polycrystalline silicon film. In one example, the polycrystalline silicon film corresponds to a doped polycrystalline silicon film or an undoped polycrystalline silicon film according to whether the polycrystalline silicon film is doped, and is formed accordingly. For instance, if the floating gate 160 is formed from a doped polycrystalline silicon film, a floating gate 160 is formed, in an example, through a Low Pressure Chemical Vapor Deposition (LPCVD) method using SiH4 or Si2H6 gas and dopes an impurity ion through an impurity ion implantation process, that is, an ion implantation process for forming source-drain regions 141, 143.

For example, a hard mask 180 is formed on a floating gate 160. In this example, a hard mask 180 is used as an etching mask forming a floating gate 160 to compensate for an etching margin and to function as a protective film for protecting a floating gate 160 simultaneously. In one example, a hard mask 180 is formed from an oxide film or a nitride film or is constructed in a form of a stacked film of an oxide film and a nitride film.

In this example, a dielectric film 220 is formed between a floating gate 160 and a control gate 170 to insulate a floating gate 160 and a control gate 170. In the example of FIG. 2, a dielectric film 220 is illustrated further.

A control gate 170 is formed on an either side of a floating gate 160 so as to have a shape that envelopes the entire surface of a floating gate 160. Therefore, a control gate 170 appears to be separated in a cross-sectional diagram but, in a plane diagram, a control gate 170 is actually a single continuous structure. In this example, a control gate 170 is electrically insulated from a floating gate 160 by a dielectric film 220. Also, a control gate 170 is formed in a foreside of an ion implantation area for regulating a program threshold voltage 150 and is potentially electrically insulated from an ion implantation area for regulating a program threshold voltage 150 by a gate insulator film 230 for the control gate.

FIG. 2 is a cross-sectional block diagram magnifying a floating gate and a control gate formed in a foreside of an ion implantation area for regulating a program threshold voltage.

In the example of FIG. 2, a tunnel oxide film 210 is formed between a foreside of an ion implantation area for regulating a program threshold voltage 150 and an underneath of a floating gate 160. In examples, the tunnel oxide film 210 is formed from a pure oxide film, an oxide film formed by a metal insulator film with high dielectric constant or a nitride film. However, these are only examples and other appropriate materials are used in other examples.

For example, a tunnel oxide film 210 transfers electrons from an ion implantation area for regulating a program threshold voltage 150 to a floating gate 160 or from a floating gate 160 to an ion implantation area for regulating a program threshold voltage 150 according to an operation of a non-volatile memory device. Therefore, a thickness of a tunnel oxide film 210 is thicker than a thickness of a gate insulator film 230 for the control gate.

A dielectric film 220 is formed between a floating gate 160 and a control gate 170. In an example, the dielectric film 220 is composed of a sidewall oxide film 221 in contact with a sidewall of a floating gate 160, a sidewall nitride film 223 formed to be adjacent to a sidewall oxide film 221 and a high voltage oxide film 225 formed to envelop a sidewall of a sidewall nitride film 223 and an underneath of a control gate 170. In one example, a dielectric film 220 is formed from a high dielectric constant film including a tantalum oxide film, an aluminum oxide film or a hafnium oxide film or is formed from a stacked film in which a tantalum oxide film or aluminum oxide film and a hafnium oxide film are alternatively arrayed. However, these are only examples, and alternative materials or groups of materials are used to form the dielectric film 220 in other examples.

A sidewall oxide film 221, after a floating gate 160 is formed, is formed in a sidewall of a floating gate 160 through a thermal oxidation method, a Low Pressure Chemical Vapor Deposition (LPCVD) method, or a plasma type method, to remove defects caused by etching damage. Also, a sidewall oxide film 221 prevents electrons from being transferred from a floating gate 160 to a control gate 170 through a sidewall oxide film 221.

FIGS. 3A-3E are diagrams illustrating a procedure of manufacturing a non-volatile memory device in FIG. 1.

Figure 3A:
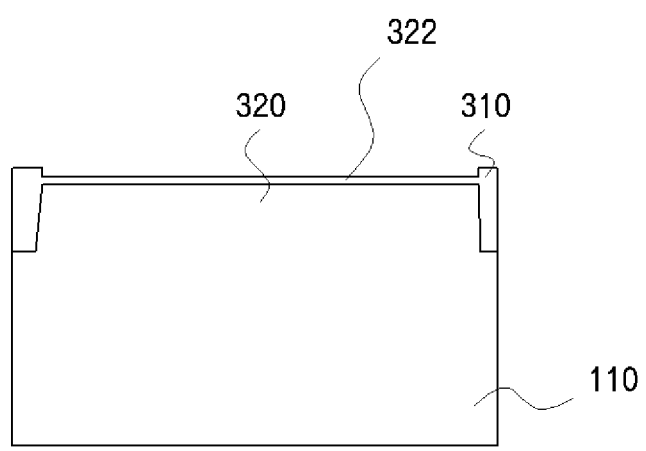
FIGS. 3A-3E are diagrams illustrating a procedure of manufacturing a non-volatile memory device as illustrated in FIG. 1.
Figure 3B:
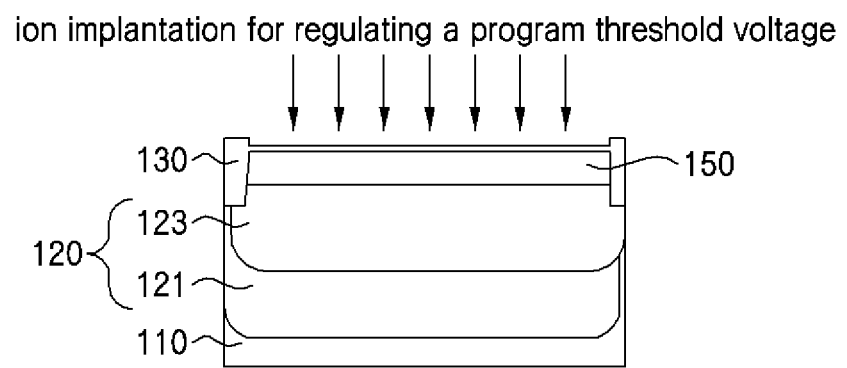

In FIG. 3A and FIG. 3B, a shallow trench isolation region (STI) 130 is formed in a semiconductor substrate 110 so as to construct a shallow trench isolation region 310 and an active region 320. Here, a shallow trench isolation region 310 is a region that electrically insulates a device from other devices and an active region 320 is a region that forms a conductive region through a manufacture process of a non-volatile memory device. Before ion implantation, a screen oxide film 322 is formed on the surface of a semiconductor substrate 110 to reduce damage on the top surface of the semiconductor substrate caused by ion implantation.

In FIG. 3B, a well region 120 is formed on an active region 320 of a semiconductor substrate 110. A well region 120 is divided into a deep N well 121 region and a P well 123 region to be formed. A deep N well 121 is located between a semiconductor substrate 110 and a P well 123 in order to electrically separate a P well 123 regions from a semiconductor substrate 110.

In this example, an ion implantation area for regulating a program threshold voltage 150 implants a P-type dopant using a blanket implantation in an active region 320 of a semiconductor substrate 110. Here, a program voltage Vp of a non-volatile memory device 100 is determined according to a dose of dopant. After performing the ion implantation, the screen oxide 322 is removed.

Figure 3C:
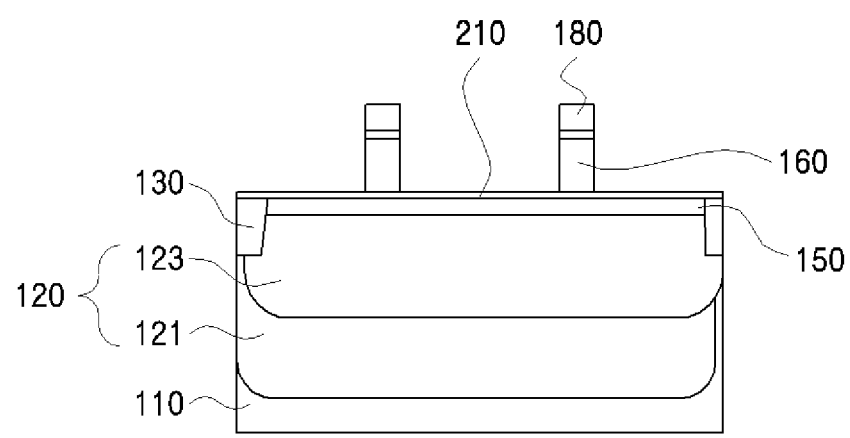

In FIG. 3C, a tunnel oxide film 210 is deposited on the ion implantation area 150 for regulating a program threshold voltage. A floating gate 160 is formed over the tunnel oxide film 210 or the channel doping region 150 using a hard mask 180.

Figure 3D:
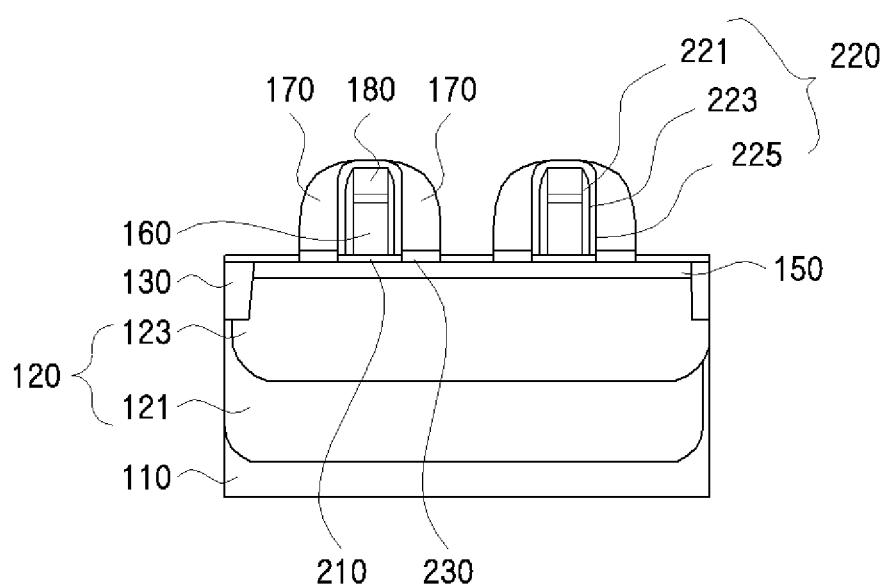

In FIG. 3D, a dielectric film 220 is constructed in a form that envelops a floating gate 160 and is composed of a sidewall oxide film 221, a sidewall nitride film 223 and a high voltage oxide film 225. A sidewall oxide film 221, a sidewall nitride film 223 and a high voltage oxide film 225 are laminated in order for a floating gate 160 to be formed. In one example, a thickness of a high voltage oxide film 225 is thicker than a thickness of a sidewall oxide film 221, or a sidewall nitride film 223.

In this example, a thick gate insulator film 230 is formed over the ion implantation area 150, which is used for gate insulating layer for the control gate 170. Herein, both the thick gate insulator film 230 and the high voltage oxide film 225 are formed of the same material and single continuous layer. A control gate 170 is formed on the thick gate insulator film 230 in a form of a spacer and it also surrounds a dielectric film 220. A conductive material, for example, poly-silicon film, is deposited over the hard mask 180 and the dielectric film 220 and the thick gate insulator film 230 and then followed by etch-back process. The hard mask 180 over a floating gate 160 is exposed after etch-back process and a control gate 170 is finally formed in a form of a spacer on the dielectric film 220.

Figure 3E:
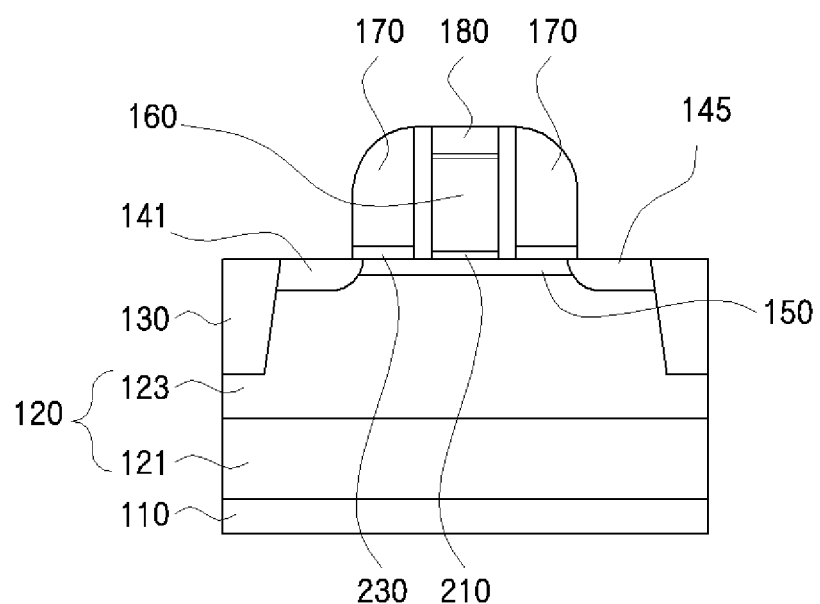

In FIG. 3E, a lightly doped drain (LDD) region is formed through an LDD ion implantation. A LDD spacer, not shown, is formed after a control gate 170 is formed. Also, source-drain regions 141, 143 are formed aligned at a side of the LDD spacer using an N-type dopant. After ion implantation, high temperature annealing progress for diffusing and activating source-drain regions 141, 143. The channel doping region 150 contacts the source-drain regions 141, 143.

Figure 4:
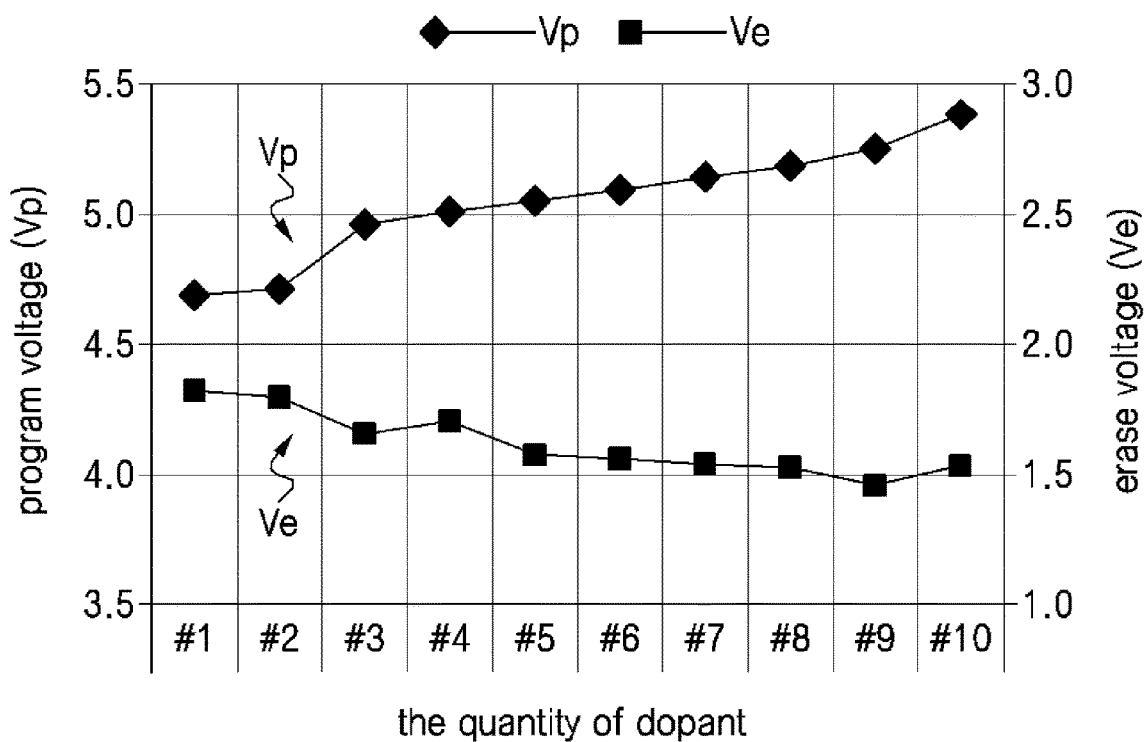
FIG. 4 is a graph illustrating a change of a program voltage Vp and a erase voltage Ve according to the quantity of dopant implanted to the ion implantation area for regulating a program threshold voltage in FIG. 1.

FIG. 4 is a graph illustrating a change of a program voltage Vp and a erase voltage Ve according to the quantity of dopant implanted into the ion implantation area for regulating a program threshold voltage in the example of FIG. 1.

In FIG. 4, a non-volatile memory device 100 performs a program or an erase operation according to an electron transfer direction in an ion implantation area for regulating a program threshold voltage 150. A floating gate 160 of a non-volatile memory device 100 is insulated from a control gate 170 by a dielectric film 220. Also, a non-volatile memory device 100 stores data by managing storage electrons in a floating gate 160 in the case of transferring electrons from an ion implantation area for regulating a program threshold voltage 150 to a floating gate 160.

As shown in FIG. 4, a voltage level of a program voltage Vp and an erase voltage Ve is determined according to the quantity of dopant implanted into the ion implantation area for regulating a program threshold voltage 150. In a graph of FIG. 4, it is known that a voltage level of a program voltage Vp and an erase voltage Ve change according to a dose of dopant implanted into an ion implantation area for regulating a program threshold voltage 150. As a dose of dopant implanted to the ion implantation area for regulating a program threshold voltage 150 increases, increasing from #1 to #10, where these quantities represent different, increasing quantities of dopant, a program voltage Vp increases and an erase voltage decreases. The reason that a program voltage Vp increases is ion implantation of dopant having a same conductivity type of a P well 123 region to an ion implantation area for regulating a program threshold voltage 150. In other words, electrons transfer to a floating gate 160 only when a corresponding high program voltage Vp is supplied to generate FN-tunneling of electron carrier as a P-type concentration of a P well 123 region increases. Here, a erase voltage Ve corresponds to a voltage generated between a control gate 170 and a P well 123 region. However, an erase voltage Ve decreases if a portion of electrons is out-diffused from an ion implantation area for regulating a program threshold voltage, where the area is channel doping region 150, into the active region 320 outside doping region 150 during a high temperature annealing process.

As shown in FIG. 4, a voltage level difference between a program voltage Vp and a erase voltage Ve increases according to increasing of a dose of dopant implanted to an ion implantation area for regulating a program threshold voltage. In one example, the quantity of dopant implanted to an ion implantation area for regulating a program threshold voltage is formed with a concentration in a range of $1E11/cm^2$ to $1E14/cm^2$.

It is an erase state that a cell current is larger than 6 µA and a program state that a cell current is smaller than 6 µA when sweeping a voltage in a control gate 170. In an erase state, it is correspondingly easy that a cell current is larger than 6 µA since a lot of electrons ejected from a floating gate 160 are distributed in a channel region. On the other hand, since a lot of electrons are transferred from a channel region into a floating gate 160, a cell current flowing through a channel is very small. Therefore, a voltage of a control gate 170 needs to be increased up to 4.5V so that a cell current reaches 6 µA. A voltage corresponding 6 µA cell current, for example 4.5V, is called a program threshold voltage. In the present examples, a floating gate channel (FG Channel) region includes more P-type dopant than usual, and hence a cell current becomes smaller accordingly. So, it is necessary to sweep a control gate 170 with a higher voltage for reaching 6 µA. Then, a threshold voltage Vt of a program voltage increases further as well.

An increasing program threshold voltage according to the present invention is caused by decreasing a cell current through implanting a P-type dopant to a floating gate channel region 150b.

Figure 5:
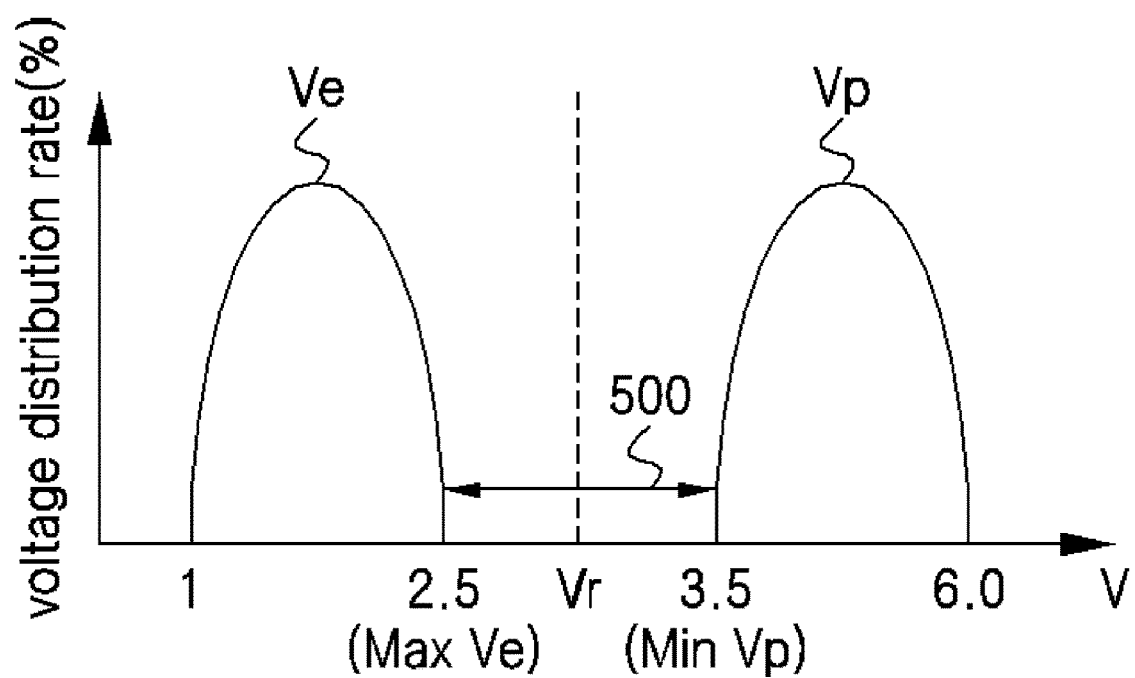
FIG. 5 is a graph illustrating an operation according to a voltage level difference between a program voltage Vp and a erase voltage Ve of a non-volatile memory device in FIG. 1.

FIG. 5 is a graph illustrating a voltage distribution of a program voltage Vp and a erase voltage Ve and illustrating an operation according to a voltage level difference 500 between the program voltage Vp and the erase voltage Ve of a non-volatile memory device in the example of FIG. 1.

In FIG. 5, a program threshold voltage Vt of a non-volatile memory device 100 is determined to fall in a range of 3.5V to 6.0V. If a user instructs a program in a non-volatile memory device 100, electrons stored into an ion implantation area for regulating a program threshold voltage 150 pass through a tunnel oxide film 210 in order to be transferred into a floating gate 160 and the quantity of electron increases to be determined as 1 with respect to the operation being performed.

In addition, a program threshold voltage Vt of a non-volatile memory device 100 is determined to fall in a range of 1V and 2.5V. If a user asks for an erase operation, electrons transferred by a program operation pass through a tunnel oxide film 210 to get out into a well region 120. In other words, as electrons are transferred into an ion implantation area for regulating a program threshold voltage 150, electrons stored into a floating gate 160 decrease to be determined as 0 with respect to the operation being performed.

In FIG. 5, a read voltage Vr refers a reference to check a voltage level difference between a program voltage Vp and a erase voltage Ve and a voltage level difference between a program voltage Vp and a erase voltage Ve accordingly affects a retention life time or endurance of a non-volatile memory device 100 according to an example. If a voltage level difference between a program voltage Vp and a read voltage Vr is small, a retention life time corresponds to the voltage level difference appropriately, such as 10 years in an 85° C. environment. Here, retention means whether storage capacity storing electrons is maintained in certain level, and whether the relevant data is accordingly preserved.

For example, FIG. 5 shows one case that a read voltage Vr is approximately 3.0V, a minimum value of program voltage Vp is approximately 3.5V and a maximum value of erase voltage Ve is approximately 2.5V. The difference between the maximum erase voltage Max Ve and a minimum program voltage Min Vp is around 1.0V. Accordingly, a minimum value of program voltage Vp is closer to a read voltage Vr or a maximum value of erase voltage Ve is closer to a read voltage Vr, which affects a retention life time or an endurance of a non-volatile memory device 100. Here, endurance corresponds to a intrinsic characteristic of companies or manufactures and endurance is determined by observing the change of a erase voltage Ve after a program and erase is repeated about 10,000-100,000 times. More specifically, a retention is determined through the test corresponding to 10% of endurance spec, and should guarantee 10 years in an 85° C. generally, as a typical expectation of retention, although other standards for endurance and retention are potentially used in other examples.

In the present examples, a voltage level difference between a program voltage Vp and a erase voltage Ve increases. In other words, as a voltage level difference between a program voltage Vp and a erase voltage Ve increases, a durability of a non-volatile memory device 100 is guaranteed. If a voltage level difference between a program voltage Vp and a erase voltage Ve decreases, a program state is not distinguishable from a erase state. For ensuring a decision about a program state and a erase state, a voltage level difference between a program voltage Vp and a erase voltage Ve should be maintained to some degree. In the case that a tunneling oxide film deteriorates in a retention test for electrons to get out from a floating gate 160 to a channel region, a program voltage Vp decreases. If this phenomenon occurs very quickly, a program voltage Vp becomes close to a erase voltage Ve and 10 years is not guaranteed. Therefore, it is desired that a program voltage Vp is far away from a erase voltage Vein readiness for such case to avoid such problems.

For increasing a voltage level difference between a maximum erase voltage Max Ve and a minimum program voltage Min Vp, a dopant of the conductivity type of a P well 123 region is implanted into a floating gate channel region and a control gate channel region having a dose in a range of $1E11/cm^2$ and $1E14/cm^2$ and preferably, $1E11/cm^2$ and $1E13/cm^2$. Therefore, the difference between the maximum erase voltage Max Ve and the minimum program voltage Min Vp is more than 1.0 V. It is desired that such a dopant implantation process progresses before a floating gate 160 and a control gate 170 are formed. More specifically, a dopant implantation process progresses before a formation of a tunnel oxide film 210 or a gate insulator film 230 for a control gate. Therefore, such dopant is implanted after a formation of a P well 123 or simultaneously with a formation of a P well 123. Hence, the present examples simultaneously implant ions into a floating gate region and a control gate region to regulate a program voltage Vp and a erase voltage Ve at the same time.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

Flash memory devices are non-volatile memory devices that can maintain stored data even when power is cut off. Due to an increase in the use of mobile devices, such as cellular phones, smart phones, personal digital assistants (PDAs), digital cameras, portable game consoles, MP3 players, and Global Positioning System (GPS) navigation devices, flash memory devices are becoming more widely used to store data and programs. However, flash memory devices also may be used in home applications, such as high-definition televisions (HDTVs), DVD players, Blu-ray players, and routers.

Flash memory devices and/or memory controllers may be packaged in packages, such as Package on Packages (PoPs), Ball Grid Arrays (BGAs), Chip Scale Packages (CSPs), Plastic Leaded Chip Carrier (PLCC), Plastic Dual In-Line Package (PDIP), Die in Wafer Form, Chip on Board (COB), Ceramic Dual In-Line Package (CERDIP), Metric Quad Flat Package (MQFP), Thin Quad Flat Package (TQFP), Quad Flat Package (QFP), Small Outline Integrated Circuit (SOIC), Shrink Small Outline Package (SSOP), Thin Small Outline Package (TSOP), System in Package (SiP), Multi-Chip Package (MCP), Wafer-Level Fabricated Package (WFP), Wafer-Level-Processed Stack Package (WSP), and any other packages that are known to one of ordinary skill in the art.

The flash memory devices and/or the memory controllers may constitute memory cards. In this case, the memory controllers may be configured to communicate with an external device, such as a host computer, using an interface protocol, such as Universal Serial Bus (USB), MultiMediaCard (MMC), Peripheral Component Interconnect Express (PCIe), Peripheral Component Interconnect eXtended (PCI-X), Peripheral Component Interconnect (PCI), Serial Advanced Technology Attachment (ATA) (SATA), Parallel ATA (PATA), Small Computer System Interface (SCSI), Enhanced Small Device Interface (ESDI), Integrated Drive Electronics (IDE), or any other interface protocol that is known to one of ordinary skill in the art.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A non-volatile memory device, comprising:
   a semiconductor substrate;
   a well region of a first conductivity type situated on the semiconductor substrate;
   dopant implanted into an ion implantation area, the ion implantation area situated in the well region;
   a floating gate situated on the well region;
   a control gate situated on both sides of the floating gate;
   a tunnel oxide film situated between the floating gate and the ion implantation area;
   a dielectric film situated between the floating gate and the control gate, wherein the dielectric film is formed to be in contact with a sidewall of the floating gate and a sidewall of the tunnel oxide film; and
   a gate insulator film disposed between the control gate and the ion implantation area, wherein a thickness of the gate insulator film is smaller than a thickness of the dielectric film.

2. The non-volatile memory device of claim 1, further comprising:
   a shallow trench isolation (STI) region situated a side of the semiconductor substrate, wherein a depth of the STI region is shallower than a depth of the well region; and
   a source-drain region exposed at a side of the control gate and situated in the well region, wherein the source-drain region is overlapped with the control gate.

3. The non-volatile memory device of claim 2, wherein a depth of the ion implantation area is shallower than a depth of the source-drain region.

4. The non-volatile memory device of claim 1, wherein the ion implantation area comprises a floating gate channel region and a control gate channel region.

5. The non-volatile memory device of claim 4, wherein an increased dose of dopant is implanted into the ion implantation area to cause a voltage level difference between a program voltage and an erase voltage.

6. The non-volatile memory device of claim 5, wherein a voltage level of the program voltage is within a range of 3.5V and 6V and a voltage level of the erase voltage is within a range of 1V and 2.5V.

7. The non-volatile memory device of claim 1, wherein the dopant implanted into the ion implantation area is formed with a dose in a range of 1E11 ions/cm$^2$ and 1E14 ions/cm$^2$.

8. A method of manufacturing a non-volatile memory device, comprising:
   forming a shallow trench isolation (STI) region and an active region on a semiconductor substrate;
   forming a well region in the active region of a first conductivity type;
   implanting a dopant into the active region to form an ion implantation area, the ion implantation area being situated in the well region;
   forming a tunnel oxide film on the ion implantation area;
   forming a floating gate on the tunnel oxide film;
   forming a dielectric film to envelop the floating gate, wherein the dielectric film is formed to be in contact with a sidewall of the floating gate and a sidewall of the tunnel oxide film;
   forming a control gate to surround the dielectric film; and
   forming a source-drain region, exposed at a side of the control gate, on the well region, wherein the source-drain region is overlapped with the control gate.

9. The method of manufacturing a non-volatile memory device of claim 8, wherein a doping concentration of the ion implantation area is greater than a doping concentration of the well region.

10. The method of manufacturing a non-volatile memory device of claim 8, wherein the ion implantation area is situated in an area underneath of the floating gate and the control gate.

11. The method of manufacturing a non-volatile memory device of claim 8, wherein an increased dose of dopant is implanted into the ion implantation area to cause a voltage level difference between a program voltage and an erase voltage.

12. The method of manufacturing a non-volatile memory device of claim 11, wherein a voltage level of the program voltage is within a range of 3.5V and 6V and a voltage level of the erase voltage is within a range of 1 V and 2.5V.

13. The method of manufacturing a non-volatile memory device of claim 8, wherein the dopant implanted into the ion implantation area is formed with a dose in a range of 1E11/cm$^2$ and 1E14/cm$^2$.

14. The method of manufacturing a non-volatile memory device of claim 8, wherein a depth of the ion implantation area is shallower than a depth of the source-drain region.

15. A non-volatile memory device, comprising:
   a floating gate situated on a well region situated on a semiconductor substrate;
   a control gate situated on both sides of the floating gate;
   dopant implanted into an ion implantation area, the ion implantation area situated between an area underneath of the floating gate and the control gate and a foreside of the well region;
   a tunnel oxide film situated between the floating gate and the ion implantation area; and
   a dielectric film situated between the floating gate and the control gate, wherein the dielectric film is formed to be in contact with a sidewall of the floating gate and a sidewall of the tunnel oxide film; and
   a gate insulator film disposed between the control gate and the ion implantation area,
   wherein a thickness of the gate insulator film is smaller than a thickness of the dielectric film.

16. The non-volatile memory device of claim 15, further comprising:
   a shallow trench isolation (STI) region situated a side of the semiconductor substrate, wherein a depth of the STI region is shallower than a depth of the well region; and
   a source-drain region exposed at a side of the control gate and situated in the well region, wherein the source-drain region is overlapped with the control gate.

17. The non-volatile memory device of claim 16, wherein a depth of the ion implantation area is shallower than a depth of the source-drain region.

18. The non-volatile memory device of claim 15, wherein a voltage level difference between a program voltage and an erase voltage is increased by providing an increased dose of dopant implanted into the ion implantation area.

19. The non-volatile memory device of claim 1, further comprising another well region of a second conductivity type situated between the semiconductor substrate and the well region.

20. The non-volatile memory device of claim 15, further comprising another well region of a second conductivity type situated between the semiconductor substrate and the well region.

21. The method of manufacturing a non-volatile memory device of claim 8, further comprising:
   forming a gate insulator film on the well region, and
   wherein the gate insulator film is disposed between the control gate and the ion implantation area, wherein a thickness of the gate insulator film is smaller than a thickness of the dielectric film situated between the floating gate and the control gate.

22. The method of manufacturing a non-volatile memory device of claim 8, further comprising:
   forming a lightly doped drain region after forming the control gate.

* * * * *